United States Patent [19]

Descamps

[11] Patent Number: 5,532,606
[45] Date of Patent: Jul. 2, 1996

[54] ELECTRICAL TESTING PROCESS

[75] Inventor: Pierre Descamps, Rixensart, Belgium

[73] Assignee: Dow Corning S. A., Seneffe, Belgium

[21] Appl. No.: 323,641

[22] Filed: Oct. 17, 1994

[30] Foreign Application Priority Data

Oct. 19, 1993 [GB] United Kingdom ............ 9321502

[51] Int. Cl.⁶ ........................................ G01N 27/02
[52] U.S. Cl. .................... 324/674; 324/681; 324/719; 427/2.11
[58] Field of Search .................... 324/663, 671, 324/674, 681, 686, 707, 713, 719; 427/2.11

[56] References Cited

U.S. PATENT DOCUMENTS 4,006,405  2/1977  Greenwood et al. .................... 324/227

OTHER PUBLICATIONS

ISO 2931, "Anodic Oxidation Coatings On Aluminium, and Its Alloys," British Standards Institution, Dec. 1984.
ISO 2134, "Anodic Oxidation Coating On Aluminium and Its Alloys," Organisation Internationale De Normalization, Jan. 1981.

Japanese Journal of Applied Physics, vol. 29, No. 9, Sep. 1990, pp. 1751–1756, Kiyohara et al., 'Determination of Capacitances and Conductances of the Constituent Phases . . .'.

IEEE 1983 Int. Symp. on Circuits and Systems, vol. 3, May 4, 1983, pp. 1118–1120, Shinoda et al., 'Element–Value Determination of LCR Networks . . .'.

Applied Physics Letters, vol. 62, No. 18, May 3, 1993, p. 2286–2287, Aboelfotoh, 'Dielectric Loss in Thin Films . . .'.

Journal of Applied Electrochemistry, vol. 17, 1987, pp. 641–647, Barcia et al., 'Measurements of Electrochemical Impedance . . .', month unavailable.

Primary Examiner—Kenneth A. Wieder
Assistant Examiner—Diep Do
Attorney, Agent, or Firm—Roger H. Borrousch

[57] ABSTRACT

A method and apparatus for determining surface characteristics of a layer (e.g. anodised aluminum) by measuring electrical impedance thereof and solving specified equations.

6 Claims, 3 Drawing Sheets

ELECTRICAL TESTING PROCESS

This invention is concerned with an electrical testing process suitable, for example for determining surface characteristics of a coating on an electrically conductive surface.

Anodised aluminium is a material used for many purposes. It is made by connecting aluminium as the anode in an electrolytic bath of ionised water with a nickel cathode. During electrolysis a film of aluminium oxide builds on the aluminium. The film generally contains a regular pattern of pores or pits having a hemispherical portion and a greater or lesser cylindrical wall. The material may be subjected to a colouring operation in which a colorant or reflectant is deposited in the pits. Subsequently the aluminium so treated is subjected to a treatment to produce a layer of crystalline monohydrate on the aluminium oxide film, which enters the pores and overcoats the film. The precise materials and procedures employed to produce the anodised aluminium govern the thickness and mutual adhesion of the layers to the aluminium and generally determines the surface characteristics of the product.

Anodised aluminium is frequently used in buildings, for example, in the construction of windows and in surface cladding. It is one practice to bond or seal glass to aluminium by adhesive techniques. In some applications the extent to which the pores are filled, and thus the nature of the surface of the anodised aluminium, is of critical interest with regard to adhesion of adhesives and sealants thereto and the durability of adhesive bonds to the aluminium. Various techniques are available for preparing anodised aluminium to accept adhesives and sealants, but the most appropriate one to use is determined by the nature of the surface to be treated. Techniques are known for determining the characteristics of surfaces but we have found them unsuitable for simple and rapid determination of detailed information about surface characteristics for various reasons. Thus, determination of porosity of an anodised aluminium surface by measuring the darkness of the trace left by a drop of colouring matter laid on the surface is not appropriate for coloured aluminium; prolonged immersion of the anodised aluminium in a sulphuric acid bath, followed by determination of the weight loss of the aluminium, requires 20 hours immersion and in any event gives a poor guide because the degree of porosity of the surface is not directly proportional to the weight loss; the test method under ISO 2931 based on analogy between the anodised aluminium layer and an equivalent electrical circuit, results in the measured quantity (the admittance at a frequency of 1000 Hz) being dependent, not only on the porosity of the surface, but also on the thickness of the layer and on the nature of any pigment present so that the surface porosity cannot be readily determined directly and, furthermore, results achieved are generally so widely dispersed that aluminium producers allocate small credit to the results of such measurements. ISO 2933 standard is based on an electrical measurement of the impedance of the anodised layer but at a single frequency and, moreover, does not give satisfactory results with coloured anodised aluminium. The use of a single frequency enables access to information which is a complex combination of data about surface properties, for example thickness of the layer and degree of solvent or pigment if present.

It is one of the various objects of the present invention to provide an improved electrical test method suitable, for example, for determining surface characteristics of a coating on an electrically conductive surface.

We have now found that one may determine the porosity of a surface of anodised aluminium comprising various layers by use of an electrical procedure based on the analogy that each layer of an electrically conductive material such as anodised aluminium has a capacitance and or resistance specific to the layer which is dependent upon its thickness and composition and which may be resolved by measuring the electrical impedance of the material over a range of frequencies.

As for the ISO 2931 method, the present invention is based on the analogy between the anodised aluminium layer and an electrical circuit. Instead of measuring the modulus of the complex admittance at fixed frequency, which quantity is a very complicated combination of different parameters of anodisation, the complex admittance is measured during a sweep in frequency. It has been demonstrated that each element of the equivalent electrical circuit can be determined independently which enables full characterisation of the surface properties (e.g. sealing of the pores, pores thickness, thickness of layer) of an anodised aluminium layer. Manipulation of the data in a process according to the invention may be carried out by a computer organised to process data automatically to determine the surface properties.

The invention provides in one of its aspects a process for determining characteristics of a substrate comprising two or more layers of different electrical capacitance which comprises passing alternating current at several frequencies across the substrate, measuring the electrical impedance at each frequency and using the information to solve equations $$Re(y) = \frac{a + b w^2 + c w^4}{1 + d w^2 + e w^4} \quad (1)$$

and $$Im(y) = \frac{s + u w^2 + v w^4}{1 + d w^2 + e w^4} \quad (2)$$

where y is the complex admittance of the substrate, w is the frequency of the measured frequency, a, b, c, d are non-linear combinations of electrical resistances analogous to each of four layers of the substrate and s, e, u, v are non-linear combinations of electrical capacitances analogous to each of four layers of the substrate.

A process according to the present invention may be used to measure the impedance over a large frequency range of the surface of a layer of anodised aluminium in order to estimate the quality of the sealing of the pores at the surface of the layer and this may be done independently of the layer thickness. The degree of sealing can be estimated on coloured aluminium independently of the type of pigment used. Also, the thickness of the surface layer may be determined without any additional measurement. In its most sophisticated form a device according to the invention may be employed to determine surface quality of aluminium profiles at the stages of production of the anodised aluminium or of quality control of aluminium panels or profiles at the time of use.

A new parameter, easy to measure with a single working frequency device, has been identified which is only dependant on the sealing quality and on the layer thickness. The layer thickness can easily be measured independently using a Foucault current measurement device. Based on that result a low cost, portable, pocket apparatus is also provided by the present invention which enables measuring of the degree of sealing on coloured and non-coloured aluminium substrates.

The invention provides in another of its aspects apparatus for determining characteristics of a substrate comprising two or more layers of different electrical capacitance which comprises means for passing alternating current at several frequencies across the substrate, means for measuring the electrical impedance at each frequency and means for using the information to solve equations $$Re(y) = \frac{a + bw^2 + cw^4}{1 + dw^2 + ew^4} \quad (1)$$

and $$Im(y) = \frac{s + uw^2 + vw^4}{1 + dw^2 + ew^4} \quad (2)$$

where y is the complex admittance of the substrate, w is the frequency of the measured frequency, a, b, c, d are non-linear combinations of electrical resistances analogous to each of four layers of the substrate and s, e, u, v are non-linear combinations of electrical capacitances analogous to the said four layers of the substrate.

The invention provides in another of its aspects a modification of the invention wherein (i) thickness of one layer of the substrate is measured independently and (ii) alternating current is passed across the substrate at a single high frequency and the information is used to solve equation (2) for a frequency (omega) which tends to infinity.

The invention provides in another of its aspects apparatus for carrying out the modification of the invention having means for passing alternating current across the substrate at a single high frequency and means for using the information to solve equation (2).

The electrical testing process allows the derivation of the electrical phase shift of an anodised aluminium surface which electrical phase shift can be used to determine the degree of surface sealing of the anodised surface. Further, the quality of adhesion of a silicone sealant to an anodised aluminium surface is dependent on the characteristics of the anodised surface, especially the degree of sealing of the anodised layer. Optimum adhesion of sealants to an anodised surface will be observed for a certain degree of surface sealing. Therefore, an electrical testing process according to the invention may be used to select those anodised aluminium surfaces which are likely to demonstrate required quality of adhesion of e.g. silicone sealant thereto.

There follows a description, to be read with the accompanying drawings, of a testing process provided by the invention and illustrative thereof.

In the drawings

Figure 1:
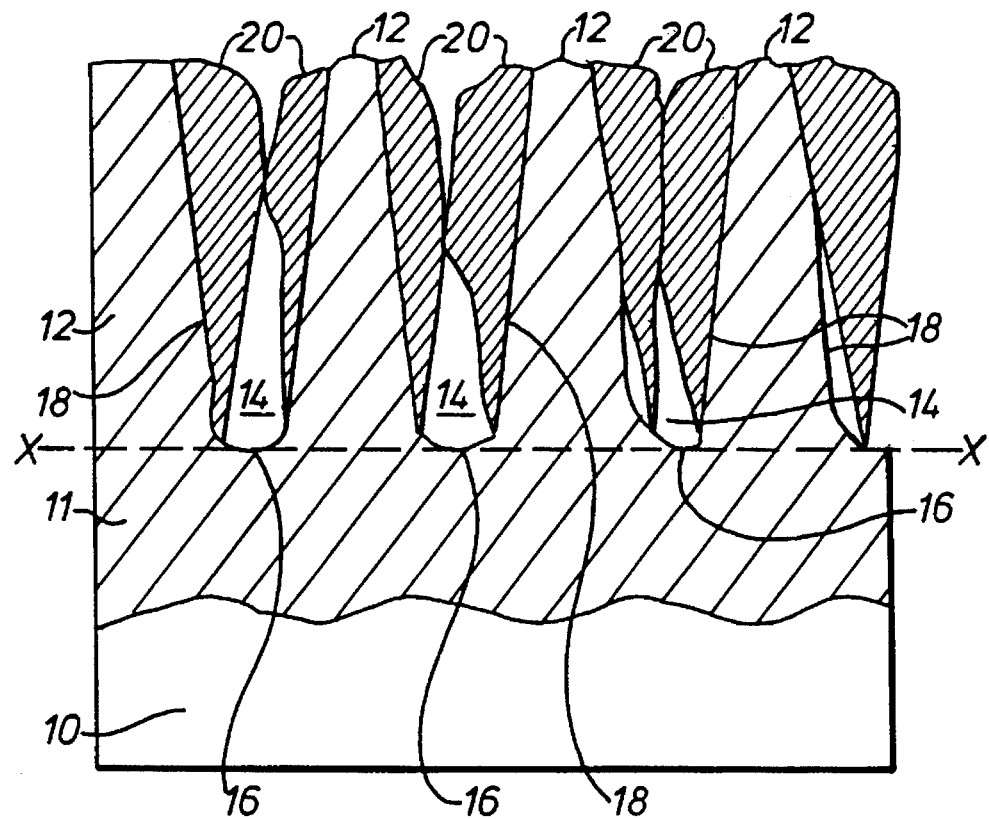
FIG. 1 is a diagrammatic section through a piece of anodised aluminium.

The piece of anodised aluminium shown in FIG. 1 comprises a body of aluminium (10) and a film of aluminium oxide adherent thereto and comprising a homogenous layer (11) demarcated by the line x—x in FIG. 1 and a series of "pillars" (12) upstanding therefrom. The pillars (12) are distributed in a regular pattern and define a series of pores (14) having a hemispherical end surface portion (16) and a cylindrical wall (18). Within the pores a layer (20) of crystalline monohydrate is present on the aluminium oxide film.

Figure 2:
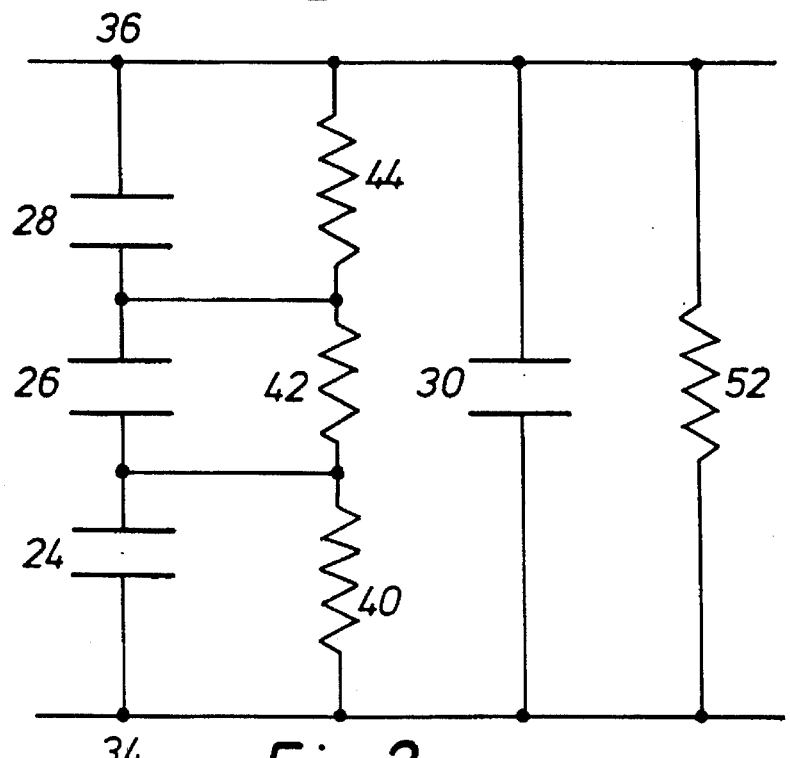
FIG. 2 is a circuit diagram of an electrical circuit analogous to the section shown in FIG. 1.

The circuit shown diagrammatically in FIG. 2 comprises a plurality of capacitors (24, 26, 28, 30) having capacitances $C_3$, $C_2$, $C_1$ and $C_0$ respectively. The capacitors (24, 26, 28) are connected to each other in series. Each corresponds to the electrical capacitance of one of the layers, the capacitor (24) corresponding to the homogenous aluminium oxide layer (11), the capacitors (26) and (28) reflect the degree of sealing of the pores. These capacitors are connected to each other in series and are connected to an input conductor (34) and an output conductor (36). The capacitor (30) has a capacitance $C_0$ and corresponds to the electrical capacitance of the homogenous aluminium oxide layer (11) plus the pillars (12) as a whole and is connected between the input and output conductors (34, 36) in parallel with the capacitors (24, 26, 28). Adjacent the series of capacitors (24, 26, 28) is a series of resistors (40, 42, 44) having resistances $R_3$, $R_2$, $R_1$ respectively which are connected to each other in series between the input and output conductors (34, 36) and in parallel with the capacitors. These resistors are each dedicated to measure the electrical resistance of one of the layers (the resistance thereof being a function of the thickness thereof). The resistor (40) corresponds to the resistance of the basic aluminium oxide layer (11), the resistance (42) or (44) corresponds to the aluminium oxide monohydrate layer (20) or the contents (if any) of the pores (14). A resistor (52) having resistance $R_0$ is connected between the input and output conductors (34, 36) in parallel with the capacitor (30). This resistor (52) has an electrical resistance dedicated to measure the resistance of the layers 11 and 12 together.

In use of the illustrative process the Real (Re) and Imaginary (Im) part of the admittance are measured during a sweep in frequency. Electrical contact between a power source capable of delivering alternating current in a wide range of frequencies and the substrate is achieved for example by a mercury or aqueous sodium chloride contact placed on the upper surface of the substrate and a metal connector applied to the lower surface as described in ISO 2931.

The Re (y) and Im (y) dependance on the measuring frequency is $$Re(y) = \frac{a + bw^2 + cw^4}{1 + dw^2 + ew^4} \quad (1)$$

$$Im(y) = \frac{s + uw^2 + vw^4}{1 + dw^2 + ew^4} \quad (2)$$

where y is the complex admittance of the layer and w is the pulsation of the measuring signal.

By fitting equations (1) and (2) to the frequency evolution of the recorded admittance, one may determine values of a, b, c, d, e, s, u, v which are non-linear combinations of $R_0$, $R_1$, $R_2$, $R_3$, $C_0$, $C_1$, $C_2$, $C_3$ where $R_0$, $R_1$, $R_2$, $R_3$ are the values in Ohms of the resistances and $C_0$, $C_1$, $C_2$, $C_3$ are the capacitance values in Faraday of the capacitors.

Figure 3:
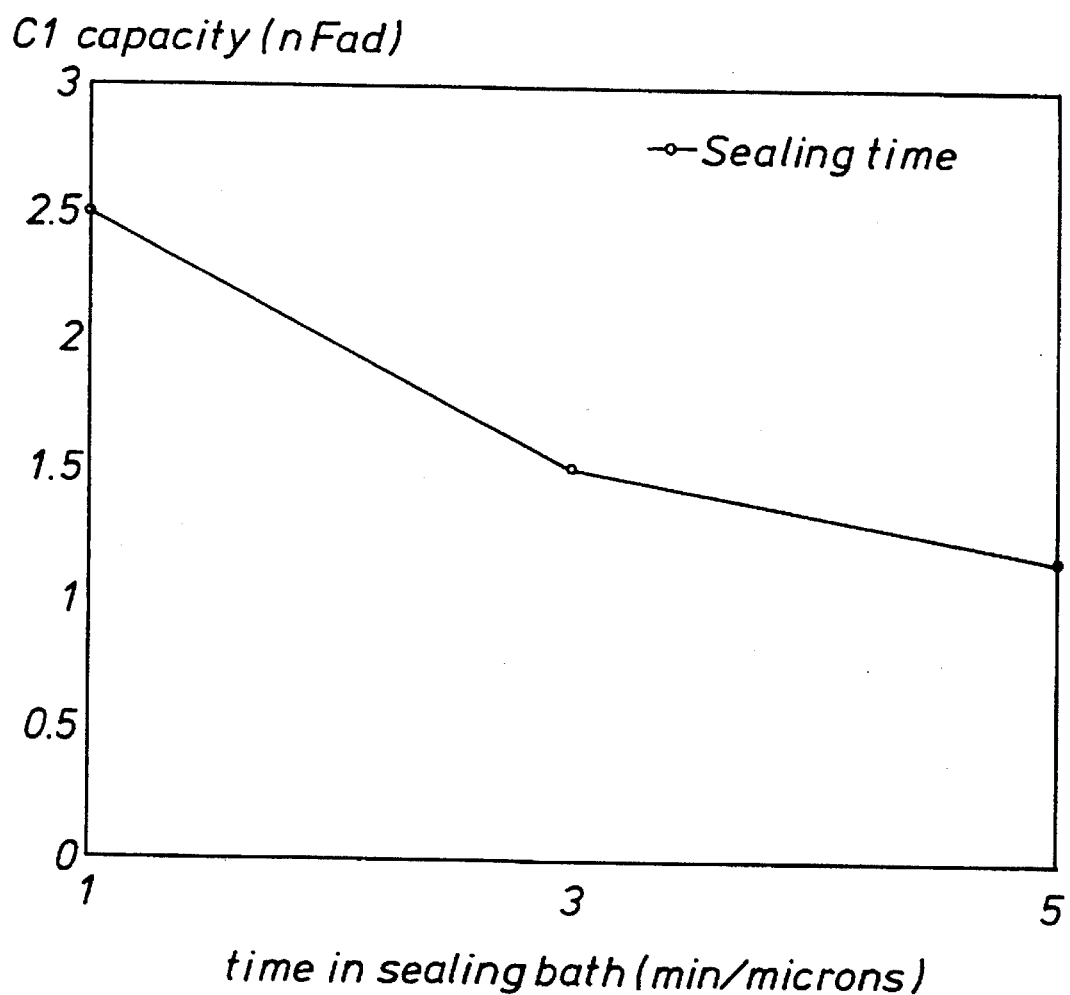
FIG. 3 is a plot of capacitance $C_1$ (reflecting the degree of sealing of the pores) versus the sealing time (minutes/micron)
Figure 4:
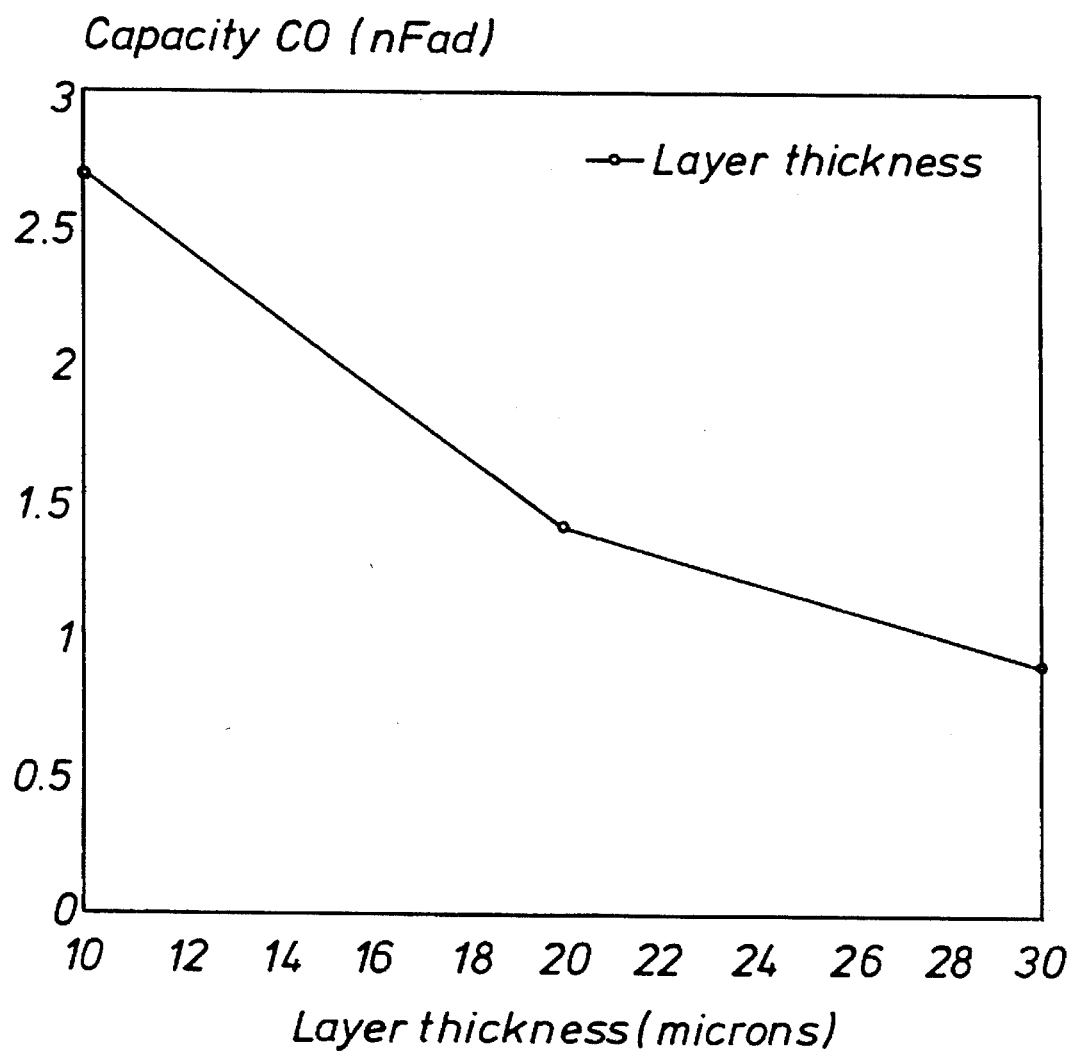
FIG. 4 is a plot of capacitance $C_0$ (reflecting the capacitance of the homogeneous layer) versus layer thickness (microns).

When solving the full system of equations, access to $C_1$ may be achieved by correlation of $C_1$ with the sealing level measured using a calibration technique wherein the capacitance is measured for a number of samples having a known degree of sealing (expressed as time spent in a sealing bath) the result of which is shown in FIG. 3. Access to $C_0$ may be achieve by correlation of $C_0$ with layer thickness measured with a Foucault current measurements device for which see FIG. 4. Thus one may, without any correction procedure deduce from measurement of the impedance as referred to above, the sealing degree, independently of the layer thickness and the thickness of the aluminium oxide layer.

By subsituting in equations 1 and 2 Re (y) and Im (y) arising from the sweep measurement the equations may be solved for the eight quantities a, b, c, d, e, s, u, v, these quantities being non-linear combinations of the circuit parameters. By solving the homogeneous system of eight equations with eight unknowns using the Levemberg—Markart algorithm one can calculate $R_1$, $R_2$, $R_3$, $R_0$, $C_0$, $C_1$, $C_2$, $C_3$. It has been demon-strated that $R_1$, $C_1$ are mainly dependant on the sealing quality. Moreover, $C_0$ is directly dependant on the pores thickness. $C_1$ has been correlated to the sealing degree measured by the technique referred to above, not taking into account the layer thickness measured by the Foucault current method. Again, the expected dependance of $C_0$ on the layer thickness is observed.

When analysing the dependance of the measured quantities on the circuit parameters one observes that v/e is dependent only on the capacitor elements of the circuit $$v/e = C_0 + \frac{C_1\ C_2\ C_3}{C_1\ C_2 + C_1\ C_3 + C_2\ C_3}$$

v/e thus depends on the degree of sealing (parameters $C_1\ C_2$) and also on the layer thickness. If the thickness of the layer is known, this parameter can be used to estimate the sealing of the pores. v/e is correlated to the ISO 2143 measurements performed on non-coloured substrates. The correlation observed is far better than the one observed when using the ISO 2931 anotest measurement.

It has been demonstrated that v/e can be used to estimate the degree of sealing if the layer thickness is known. One can demonstrate that v/e is the asymptotic value of Im (y) when frequency tends to infinity. It has been observed that, at a frequency level equal to 20 kHz, Im (y) is nearly equal to v/e. By measuring Im (y) at a single, high frequency the degree of sealing of the layer can thus be estimated accurately.

There now follows an example of a use of the electrical testing process.

A silicone sealant composition was formed by mixing together a silanol terminated polydimethylsiloxane having a viscosity of about 60,000 centistokes (39.5 parts), n-propylorthosilicate as a crosslinking agent (23.7 parts), dibutyltindilaurate (1.0 part), aminopropyltriethoxysilane as an adhesion promoter (19.8 parts) and carbon black (15.8 parts).

The electrical testing process as hereinabove described was used to determine the electrical impedance and thus derive the electrical phase shift of a number of anodised aluminium samples. The anodised samples were then cleaned by wiping with a siloxane cleaner. After allowing sufficient time for the samples to dry (about five minutes) a bead of the sealant composition was applied to the samples, a reinforcing wire mesh was placed on top of the sealant bead and a further bead of sealant composition was extruded over the reinforcing mesh. The sealant composition was allowed to cure for 14 days at ambient temperature before being immersed in 55° C. hot water for seven days and immediately afterwards subjected to the ASTM C-794 peel adhesion test. Table I below correlates the quality of sealant adhesion with the electrical phase shift measurement of the samples. The quality of adhesion is expressed as the percentage of ASTM C-794 peel test samples resulting in cohesive failure mode versus the total number of samples in a given electrical phase shift class.

TABLE I

| | Electrical Phase Shift* | | | | | | | |
|---|---|---|---|---|---|---|---|---|
| | 0.1 | 0.2 | 0.3 | 0.4 | 0.5 | 0.6 | 0.7 | 0.8 |
| % Cohesive failure | 79 | 75 | 80 | 96 | 99 | 76 | 67 | 32 |

*Electrical phase shift class of 0.4 and 0.5 represents about 85% of all samples tested The results indicate that an electrical phase shift of from 0.4 to 0.5 results in a cohesive failure rate of close to 100%.

That which is claimed is:

1. Apparatus for determining characteristics of a substrate comprising two or more layers of different electrical capacitance which comprises means for passing alternating current at several frequencies across the substrate, means for measuring the electrical impedance at each frequency and means for using the information to solve equations $$Re\,(y) = \frac{a + b\,w^2 + c\,w^4}{1 + d\,w^2 + e\,w^4} \quad (1)$$

and $$Im\,(y) = \frac{s + u\,w^2 + v\,w^4}{1 + d\,w^2 + e\,w^4} \quad (2)$$

where y is the complex admittance of the substrate, w is the frequency of the measured frequency, a, b, c, d are non-linear combinations of electrical resistances analogous to each of four layers of the substrate and s, e, u, v are non-linear combinations of electrical capacitances analogous to the said four layers of the substrate.

2. A process for determining characteristics of an anodised aluminum substrate comprising an aluminum layer, a homogenous aluminum oxide layer, of pillars of aluminum oxide interspersed by pores and a coating of crystalline monohydrate with or without additional material in the pores, each of such layers, coating and materials having a different electrical capacitance which comprises passing alternating current at several frequencies across the substrate, measuring the electrical impedance at each frequency, using the information to solve equations $$Re(y) = \frac{a + bw^2 + cw^4}{1 + dw^2 + ew^4} \quad (1)$$

and $$Im(y) = \frac{s + uw^2 + vw^4}{1 + dw^2 + ew^4} \quad (2)$$

where y is the complex admittance of the substrate, w is the frequency of the measured frequency, a, b, c, and d are non-linear combinations of electrical resistance analogous to each of four layers of the substrate and s, e, u, and v are non-linear combinations of electrical capacitances analogous to the said four layer of the substrate using values to determined values for $R_0$, $R_1$ $R_2$, $R_3$, $C_0$, $C_1$, $C_2$, $C_3$, where $R_0$ represents the electrical resistance of the homogenous aluminum oxide layer plus the pillars of the substrate, each $R_1$ and $R_2$ represents one of the electrical substrate, $R_3$ represents the electrical resistance of the homogenous aluminum oxide layer, $C_0$ represents the electrical capacitance of the homogenous aluminum oxide layer plus the pillars of the pores or the crystalline monohydrate of the substrate, each of $C_1$ and $C_2$ represents one of the electrical capacitance of the pores of the crystalline monohydrate of the substrate, and $C_3$ represents the electrical capacitance of the homogenous aluminum oxide layer and using these values to determine the thickness of the pores or the degree of sealing to the substrate.

3. A process for determining physical characteristics of a first substrate comprising two or more layers of different electrical capacitance which comprises (a) passing alternating current at several frequencies across the first substance, (b) measuring the electrical impedance at each frequency and using the information to solve equations $$Re(y) = \frac{a + bw^2 + cw^4}{1 + dw^2 + ew^4} \quad (1)$$

and $$Im(y) = \frac{s + uw^2 + vw^4}{1 + dw^2 + ew^4} \quad (2)$$

where y is the complex admittance of the substrate, w is the frequency of the measured frequency a, b, c, and d are non-linear combinations of electrical resistance analogous to each of four layers of the substrate and s, e, u, and v are non-linear combinations of electrical capacitances analogous to said four layers of the first substrate, (c) comparing the values for a, b, c, d, s, e, u, and v to those of a second substrate of known physical characteristics as a means to identifying the physically characteristics of the first substrate.

4. A process in according to claim 3 wherein (i) thickness of one layer of the substrate is measured independently and (ii) alternating current is passed across the substrate at a single high frequency and the information is used to solve equation (2).

5. A process of claim 3 wherein the thickness of one layer of the substrate is measured independently and the alternating current is passed across the substrate at a single high frequency and the information is used to solve equation (2).

6. A process of claim 5 having means for passing alternating current across the substrate at a single high frequency and means for using the information to solve equation (2).

* * * * *